United States Patent
Pas et al.

[19]

[11] Patent Number: 6,054,684

[45] Date of Patent: Apr. 25, 2000

[54] ULTRA FAST TEMPERATURE RAMP UP AND DOWN IN A FURNACE USING INTERLEAVING SHUTTERS

[75] Inventors: Michael F. Pas, Plano; C. Rinn Cleavelin, Lubbock; Sylvia D. Pas, Plano, all of Tex.

[73] Assignee: Texas Instruments Incorporated, Dallas, Tex.

[21] Appl. No.: 08/964,515

[22] Filed: Nov. 5, 1997

Related U.S. Application Data

[60] Provisional application No. 60/030,396, Nov. 5, 1996.

[51] Int. Cl.$^7$ ........................................................ F27B 5/14
[52] U.S. Cl. ........................ 219/390; 219/405; 219/411; 118/725; 118/118
[58] Field of Search .................................. 219/390, 405, 219/411; 118/724, 725, 50.1; 392/416, 418; 250/492.2

[56] References Cited

U.S. PATENT DOCUMENTS

| | | | |
|---|---|---|---|
| 4,760,244 | 7/1988 | Hokynar | 219/390 |
| 5,329,095 | 7/1994 | Okase | 219/390 |
| 5,683,242 | 11/1997 | Cronin et al. | 432/144 |

FOREIGN PATENT DOCUMENTS

| | | | |
|---|---|---|---|
| 146280 | 6/1989 | Japan | 392/416 |

*Primary Examiner*—Teresa Walberg
*Assistant Examiner*—Shawntina T. Fuqua
*Attorney, Agent, or Firm*—Mark A. Valetti; Carlton H. Hoel; Richard L. Donaldson

[57] ABSTRACT

One embodiment of the instant invention is a process chamber for heating a semiconductor wafer, the process chamber comprising: heating elements (elements 104 of FIG. 2a) for providing heating energy; means for holding (means 112 of FIG. 2a) the semiconductor wafer; and shutters situated between the heating elements and the means for holding the semiconductor wafer, the shutters (shutters 108 of FIGS. 2a and 2b and shutters of FIGS. 2c and 2d for blocking the heating energy from getting to the semiconductor wafer when the shutters are in a closed position and for directing the heating energy to the semiconductor wafer when in an open position. Preferably, the shutters are comprised of: an outer surface which is coated with a material which reflects the heating energy back towards the heating elements when the shutters are in the closed position; an inner surface which faces the means for holding the semiconductor wafer when the shutters are in the dosed position; an axis which the shutters revolve around so as to open and close; and an insulating material situated between the inner and outer surfaces.

5 Claims, 3 Drawing Sheets

ULTRA FAST TEMPERATURE RAMP UP AND DOWN IN A FURNACE USING INTERLEAVING SHUTTERS

This application claims benefit of provisional application 60,030,396 filed Nov. 5, 1996.

FIELD OF THE INVENTION

The instant invention pertains to semiconductor device fabrication and processing equipment and more specifically to a furnace which incorporates interleaving shutters so as to quickly ramp the temperature of the furnace up and down.

BACKGROUND OF THE INVENTION

Currently there are several types of semiconductor processing equipment capable of processing silicon wafers at temperatures above 350° C. This type of equipment consists of resistively heated batch furnaces which typically process 25 to 200 wafers per process run. An example of this type of system is the TEL (Tokyo Electron Limited) Alpha 8 vertical furnace. Another system involves a small or mini batch (25–100 wafers) which is also resistively heated but these systems may be used for wafer with a diameter greater than or equal to 300 mm.

There are also single wafer and dual wafer systems which are either resistively heated or lamp heated. An example of the resistively heated system is the Mattson Aspen or the Kokusai Vertron VII resistively heated two-wafer system. An example of the lamp heated system are the Applied Materials Centura RTP/HT or RTP HTF (rapid thermal processing) systems.

An important characteristic of each system is the temperature uniformity and ramp (up and down) capability. If temperature gradient across the wafer is greater than 10° C. at any time, there is a large probability of temperature-induced slip or warpage of the wafer. Table I is a comparison of the temperature ramping capability of present thermal processing tools.

TABLE 1

| Process Tool | Max. Controllable Temperature (ramp up) | Max. Controllable Temperature (ramp down) | Number of Wafers per Batch |
|---|---|---|---|
| Resistively Heated (batch furnace) | 10° C./min | 5° C./min | 25–200 |
| Resistively Heated (small batch) | 100° C./min | 60° C./min | 25–100 |
| Resistively Heated (single wafer) | not possible | not possible | 1 or 2 |
| Lamp Heated | 75° C./s | 50° C./s | 1 |

The lamp heated system has the highest ramp rate at greater than or equal to 75° C./s up and greater than or equal to 50° C./s down. The resistively heated single wafer system does not have the capability of controlling the ramp of the wafer temperature. Typically, resistively heated systems, whether a furnace or a single wafer system, are mechanically simpler since the lifetime of the furnace element is five to ten times longer than the lifetime of the lamps. In addition, the use of a thermocouple versus a pyrometery system of temperature measurement favors the resistively heated systems.

With wafer diameters increasing to 300 mm and beyond, single wafer processing is becoming increasingly important because it offers improved process uniformity and reduced defect density.

It is, therefore, an object of the instant invention to provide a wafer processing chamber which is capable of providing a quick temperature ramp up or down.

SUMMARY OF THE INVENTION

One embodiment of the instant invention involves the use of interleaving shutters, placed between the heating source and the semiconductor wafers, so as to either block off or focus the heating energy from the heating source to the semiconductor wafers. There are many advantages of this embodiment of the instant invention. First, the instant invention provides an ultra fast ramp up and down of the temperature at the wafers. Second, wafers are loaded into the furnace of the instant invention at less than 400° C. (accomplished by leaving the shutters closed), thereby avoiding native oxide growth on the wafers. Third, the quartz tube can be quickly changed since it remains cool while the shutters of the instant invention are closed. Fourth, the heating elements will last longer using the instant invention because the elements are not cycled on and off, they remain on and the shutters are open and closed.

One embodiment of the instant invention is a process chamber for heating a semiconductor wafer, the process chamber comprising: heating elements for providing heating energy; means for holding the semiconductor wafer; and shutters situated between the heating elements and the means for holding the semiconductor wafer, the shutters for blocking the heating energy from getting to the semiconductor wafer when the shutters are in a closed position and for directing the heating energy to the semiconductor wafer when in an open position. Preferably, the shutters are comprised of: an outer surface which is coated with a material which reflects the heating energy back towards the heating elements when the shutters are in the closed position; an inner surface which faces the means for holding the semiconductor wafer when the shutters are in the closed position; an axis which the shutters revolve around so as to open and close; and an insulating material situated between the inner and outer surfaces. The heating elements are, preferably, comprised of heating lamps or resistive heating elements. The means for holding the semiconductor wafer is, preferably, either a SiC boat or a quartz boat. The chamber is operable to heat one, a small number, or a plurality of semiconductor wafers.

Another embodiment of the instant invention is a method of fabricating an electrical device formed on or within a semiconductor wafer, the method comprising the steps of: placing the semiconductor wafer in a furnace which has shutters situated between the semiconductor wafer and heating elements, the shutters being in a closed position when the semiconductor wafer is placed in the furnace so as to isolate the semiconductor wafer from heating energy emitted from the heating elements; heating the semiconductor wafers by opening the shutters and subjecting the semiconductor wafer to the heating energy; and removing the semiconductor wafer from the furnace after closing the shutters so as to isolate the semiconductor wafer from the heating energy.

BRIEF DESCRIPTION OF THE DRAWINGS

FIG. 2d is taken substantially along the 2d–2d line of FIG. 2c.

FIG. 3a is a cross-sectional view of a single wafer chamber which incorporates a shutter system of the instant invention between the semiconductor wafer(s) and the heating element. FIG. 3b is a cross-sectional view of a single wafer chamber which incorporates two shutter systems of the instant invention and two heating elements.

DETAILED DESCRIPTION OF THE DRAWINGS

Figure 1:
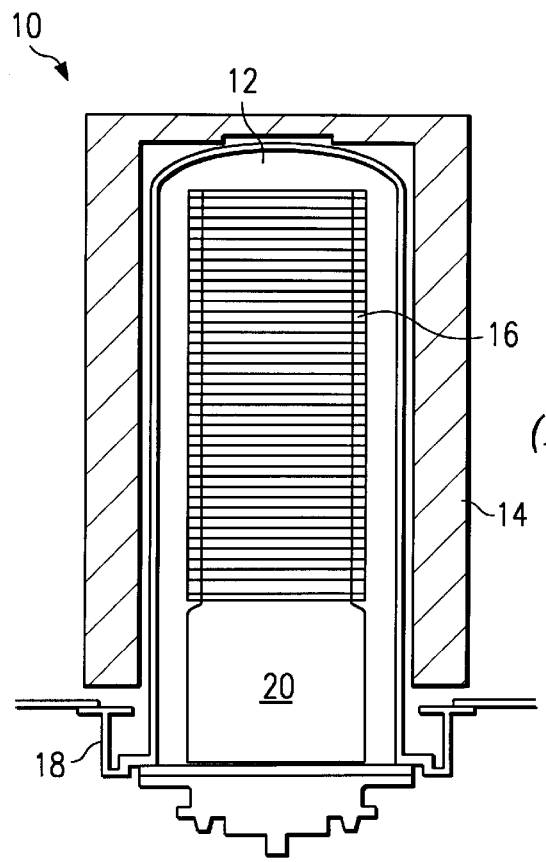
FIG. 1 is a cross-sectional view of a typical furnace used in semiconductor device fabrication.

FIG. 1 illustrates a standard furnace 10 which is used in semiconductor device fabrication. Basically, furnace 10 is comprised of boat elevator 20, heater 14, cooling water flange 18 and process tube 12. In this type of furnace, semiconductor wafers 16 are loaded into the process tube via boat elevator 20. Once in place, process tube 12 is filled with a process gas and the temperature is elevated via heaters 14. The problem with this systems is that if heaters 14 are resistive elements, it may take an exceptionally long time for the furnace to ramp up/down to the proper temperatures. A potential solution may involve preheating the furnace to the desired temperature, but this may cause problems because the first wafers put into the chamber (and portions of wafers that are put in prior to other portions of the same wafer) are subjected to different conditions than others that are subjected to the temperature later. Hence, there is not a uniform heating of all wafers (and there may not be uniform heating of entire wafers). These problems are solved, for the most part, with the instant invention.

Figure 2A:
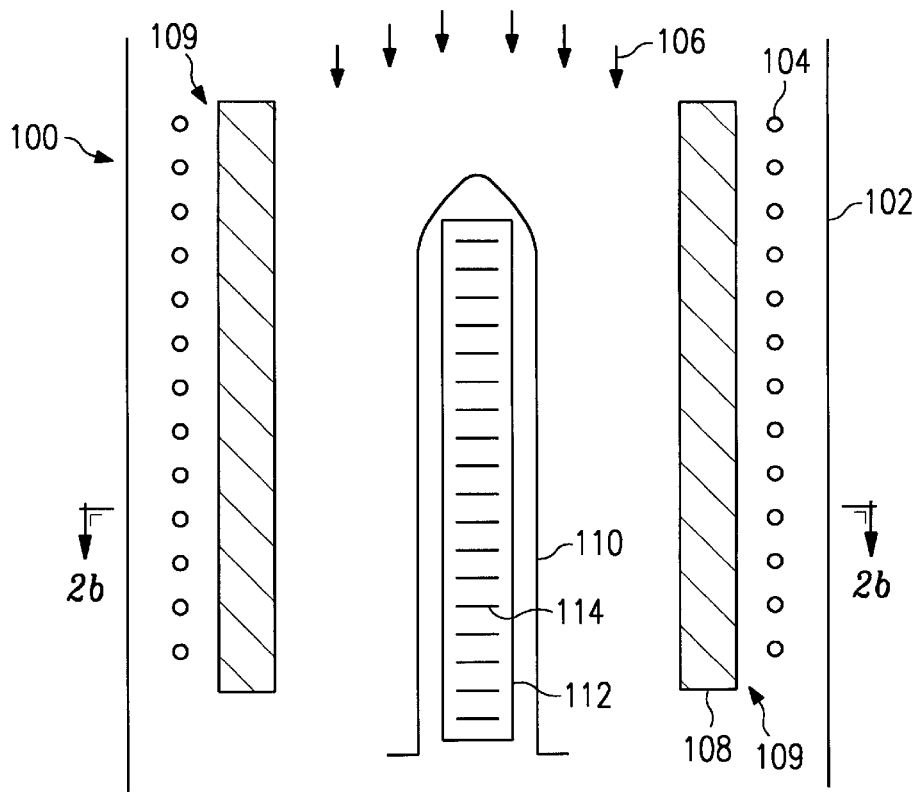
FIG. 2a is a cross-sectional view of a furnace which incorporates the shutter system of one embodiment of the instant invention.
Figure 2B:
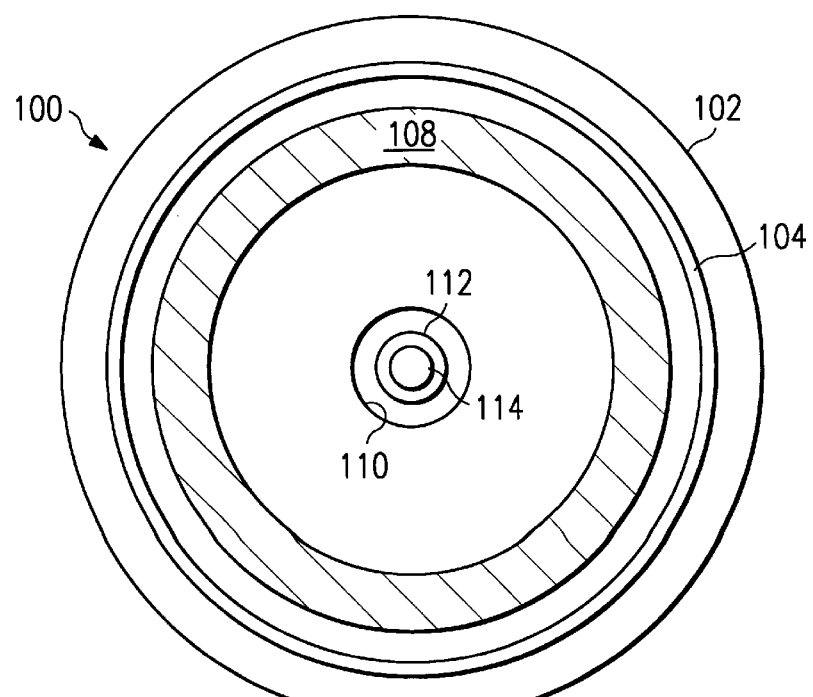
FIG. 2b is a top view (taken substantially along the 2b–2b line of FIG. 2a) of a furnace which incorporates the shutter system of the instant invention.

Referring to FIGS. 2a and 2b, furnace 100 is comprised of outer walls 102 and heating elements 104 (either resistive heating elements, heat lamps, or any other type of conventional heating source) just as standard furnaces. In addition, furnace 100 is comprised of a standard quartz tube 110 and quartz boat 112 for holding wafers 114. Note, though, that while tube 110 and boat 112 are preferably quartz, they do not have to be comprised of quartz. Tube 110 and boat 112 may be comprised of any material which will not degrade semiconductor wafers 114. Preferably, tube 110, boat 112, and semiconductor wafers 114 can be cooled by forced air flow 106.

The key difference between the instant invention and standard furnaces is the placement of shutters 108 between semiconductor wafers 114 and heating elements 104. Shutters 108 may be made of any material and may be configured in any way so long as the following criteria is met. First, shutters 108 must block/reflect a substantial amount of the heating energy generated by heating elements 104 when shutters 108 are closed. Hence, shutters 108 must be comprised of a material that substantially isolates tube 110, boat 112 and semiconductor wafers 114 from heating elements 104 when shutters 108 are closed. This may be accomplished by coating surface 109 of shutters 108 with a coating that will reflect a substantial amount of the heating energy (preferably infrared energy) emitted by heating elements 104 back towards heating elements 104. This not only provides a cooler ambient in the center of the furnace, it also saves energy, because heating elements 104 do not have to provide as much energy because a substantial amount of energy is reflected back towards the heating elements, thereby keeping these elements hot. In addition, some type of coolant may be passed through shutters 108 so as to keep them from heating up, thereby keeping the center of furnace 100 cooler while the shutters are closed.

Figure 2C:
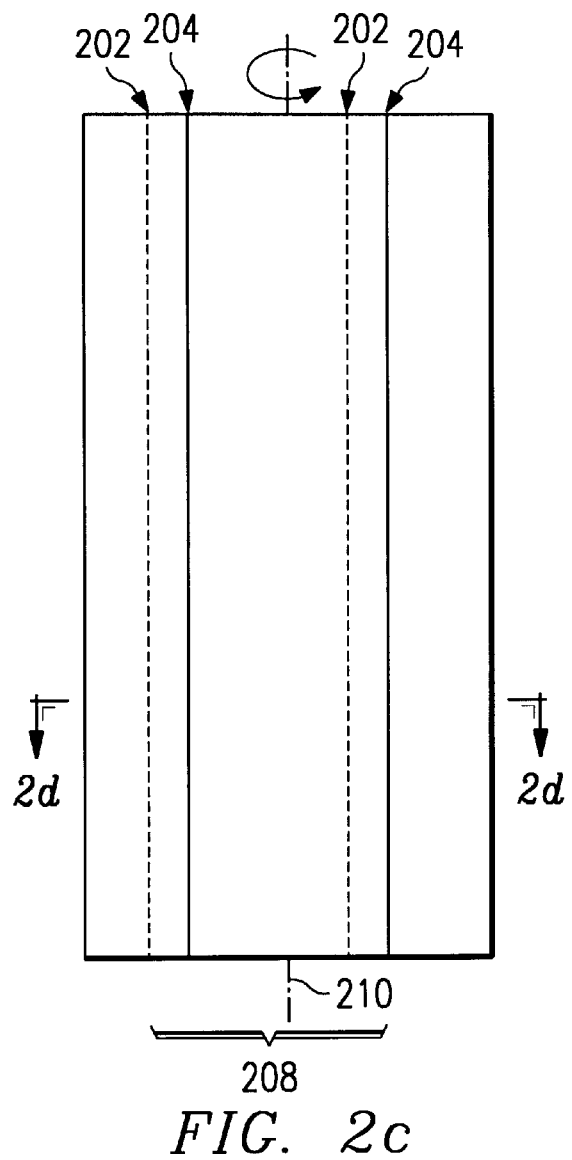
FIG. 2c illustrates one embodiment of the instant invention.
Figure 2D:
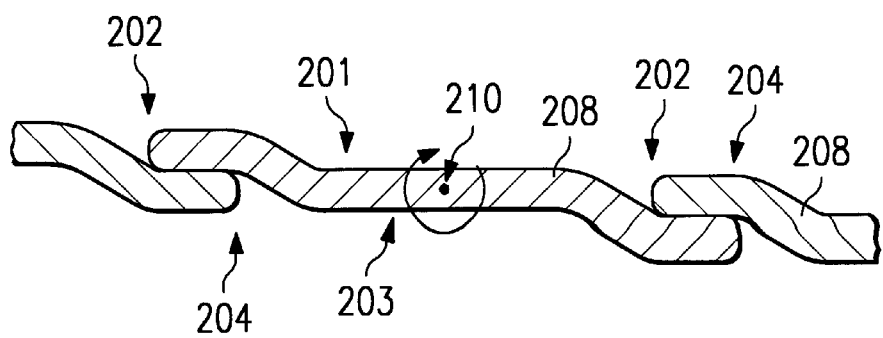
FIG. 2d is a top view of the shutter system of the embodiment of the instant invention as shown in FIG. 2c.

Referring to FIGS. 2c and 2d, to further isolate the center of furnace 100 from the heating elements 104 when shutters 108 are closed, shutters 108 are preferably interleaved so that the heating energy emitted from heating elements 104 does not leak through shutters 108. FIG. 2d illustrates one type of interleaving, but this may be accomplished in many different ways. For example, interleaving may be accomplished by making the portion of shutter 208 between regions 202 and 204 thinner so that there is no need to curve shutters 208 for them to interleave. In addition, in a cylindrical configuration as is shown in FIG. 2b, shutters 208 may need to be curved so as to form a circle when fully closed.

Second, shutters 108 must be configured such that there is little "shadowing" so that each semiconductor wafer is exposed to substantially the same amount of heating energy. In addition, shutters 108 must be configured so that substantially the entire wafer of each of the plurality of wafers is subjected to a substantially uniform amount of heating energy when shutters 108 are open. Briefly referring to FIG. 2d, shadowing may be reduced by making both surfaces 201 and 203 of shutter 208 reflective at the frequency of the particular heating energy source. The reason for this is that it may be better to reflect the energy than for the shutter to absorb it, with regards to shadowing, because reflected energy may still provide heating of a portion of the semiconductor wafers.

Third, shutters 108 must be able to quickly open and quickly close so that the ramping up/down of the temperature in the center of furnace 100 can be accomplished quickly. Briefly referring to FIGS, 2c and 2d, shutters 208 may be open/closed by rotating each shutter about their central axis (axis 210). Preferably, this would be accomplished simultaneously for each shutter.

The following description relates to another embodiment of the instant invention, specifically, the method of operating the furnace of the instant invention. Collectively referring to FIGS. 2a–2d (where a single shutter is referred to as "shutter 208" and a group of shutters is referred to as "shutters 108"), heating elements 104 (preferably either resistive heating elements or heat lamps) are energized so as to heat furnace 100. At this stage of the process, shutters 108 are closed and tube 110, boat 112, and semiconductor wafers 114 are not in the chamber. Since shutters 108 are closed, the center of furnace 100 is preferably not substantially heated and the power consumed by heating elements 104 is not too great, due to a substantial amount of heating energy (produced by heating elements 104) being reflected back to these elements by reflective surface 109.

Once heating elements 104 have reached their desired temperature, tube 110 and boat 112 (loaded with semiconductor wafers 114) are loaded into furnace 100, with shutters 108 remaining closed. After loading, shutters 108 are opened thereby causing the center of furnace 100 (along with tube 110, boat 112, and semiconductor wafers 114) to heat to the desired temperature. After heating for the desired period, shutters 108 are closed and a coolant (preferably air or any other gas) is forced through the center of, furnace 100 so as to rapidly cool the chamber. Next, tube 110 and boat 112 (which holds semiconductor wafers 114) are removed.

Figure 3A:
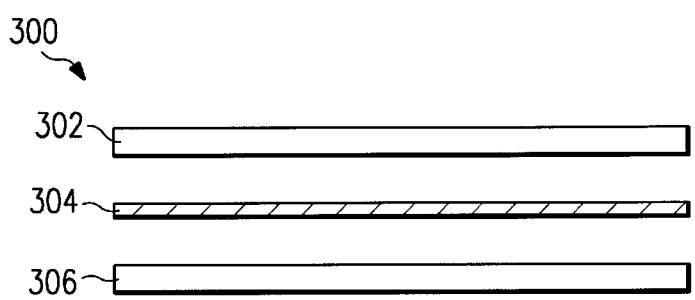
FIGS. 3a and 3b illustrate two more embodiments of the instant invention.
Figure 3B:
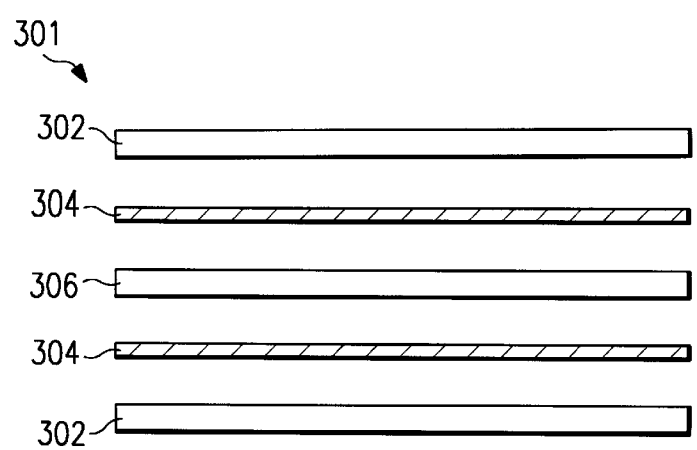

FIGS. 3a and 3b illustrate two more embodiments of the instant invention. Both embodiments are comprised of heaters 302 (preferably comprised of resistive elements or heating lamps) and semiconductor wafer holders 306. The difference between furnace 300 and 301 is that furnace 300 only has one heater and one shutter system 304, whereas furnace 301 is comprised of two heaters 302 and two shutter systems 304. Just as in the previously described embodiments, shutters 304 are preferably interleaved (preferably as is shown in FIGS. 2c and 2d) and are preferably coated with a layer of material that reflects a substantial amount of the heating energy emitted by the heaters.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A process chamber for heating a semiconductor wafer, said process chamber comprising:

heating elements for providing heating energy;

means for holding said semiconductor wafer; and shutters situated between said heating elements and said means for holding said semiconductor wafer, said shutters for blocking said heating energy from getting to said semiconductor wafer when said shutters are in a closed position and for directing said heating energy to said semiconductor wafer when in an open position, said shutters are comprised of:

an outer surface which is coated with a material which reflects said heating energy;

an inner surface which faces said means for holding said semiconductor wafer when said shutters are in said closed position;

an axis which said shutters revolve around so as to open and close; and an insulating material situated between said inner and outer surfaces.

2. The process chamber of claim 1, wherein said heating elements are comprised of heating lamps.

3. The process chamber of claim 1, wherein said heating elements are comprised of resistive elements.

4. The process chamber of claim 1, wherein said means for holding said semiconductor wafer is a SiC boat or a quartz boat.

5. The process chamber of claim 1, wherein said chamber is operable to heat a plurality of semiconductor wafers.

* * * * *